(12) United States Patent
Ashutosh et al.

(10) Patent No.: US 7,842,983 B2
(45) Date of Patent: Nov. 30, 2010

(54) BOUNDARIES WITH ELEVATED DEUTERIUM LEVELS

(75) Inventors: Ashutosh Ashutosh, Hillsboro, OR (US); Huicheng Chang, Portland, OR (US); Adrien R. Lavoie, Portland, OR (US); Aaron A. Budrevich, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 98 days.

(21) Appl. No.: 12/215,250

(22) Filed: Jun. 26, 2008

(65) Prior Publication Data

US 2009/0321855 A1 Dec. 31, 2009

(51) Int. Cl.
*H01L 29/76* (2006.01)

(52) U.S. Cl. .............. 257/288; 257/327; 257/E29.255; 438/197; 438/217; 438/289

(58) Field of Classification Search ......... 257/288–412, 257/E29.255; 438/197, 217, 289–290
See application file for complete search history.

(56) References Cited

U.S. PATENT DOCUMENTS

2008/0067508 A1\* 3/2008 Endo et al. ............. 257/43

\* cited by examiner

*Primary Examiner*—Eugene Lee
*Assistant Examiner*—Tucker Wright
(74) *Attorney, Agent, or Firm*—Winkle, PLLC

(57) ABSTRACT

A device is annealed in a deuterium atmosphere. Deuterium penetrates the device to a boundary, which is passivated by the deuterium.

7 Claims, 6 Drawing Sheets

BOUNDARIES WITH ELEVATED DEUTERIUM LEVELS

BACKGROUND

Background of the Invention

Devices such as transistors frequently have source and drain contact regions in or on a substrate. There are boundaries between the source and drain contact regions and the substrate.

DETAILED DESCRIPTION

Various embodiments of devices with boundaries between regions and elevated deuterium levels at or adjacent those boundaries are discussed in the following description. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative example representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order, in series or in parallel, than the described embodiment. Various additional operations may be performed and/or described operations may be omitted in additional embodiments.

Figure 1:
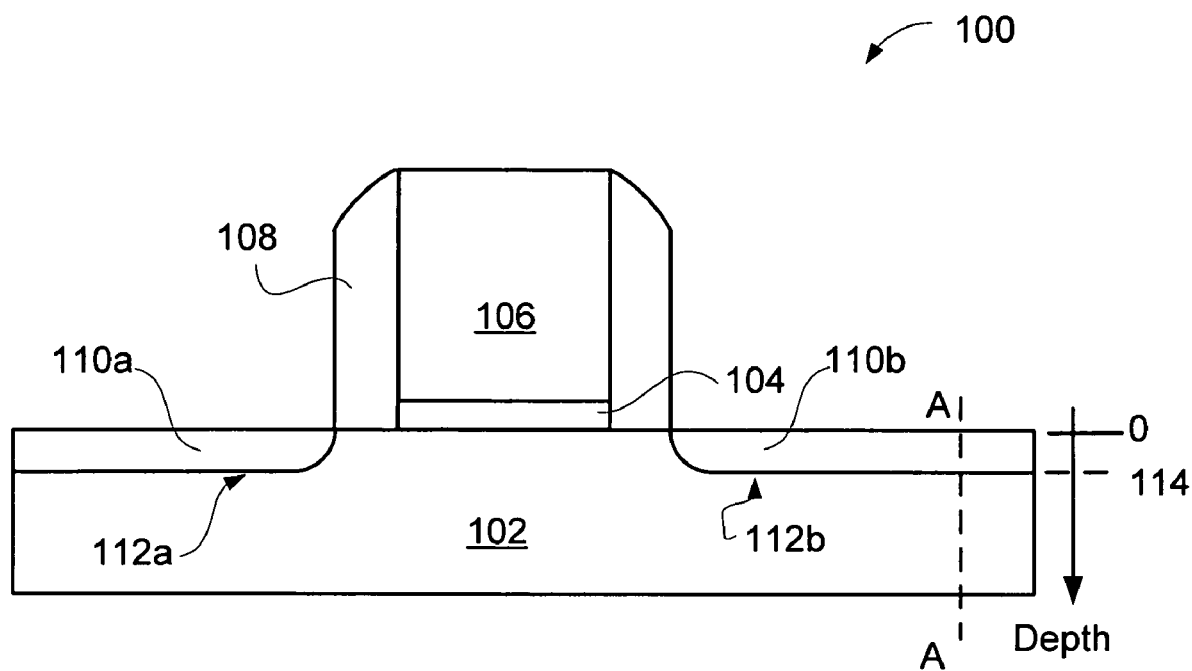
FIG. 1 is a cross sectional side view that illustrates a device having boundaries between source and drain regions and substrate.

FIG. 1 is a cross sectional side view that illustrates a device 100 having boundaries 112 between source and drain regions 110 and substrate 102, according to one embodiment of the described invention. There are elevated levels of deuterium at or adjacent the boundaries 112. In the illustrated example, there is a substrate 102. This substrate 102 may comprise any material that may serve as a foundation upon which a semiconductor device may be built. In one example, substrate 102 comprises silicon, although another material or other materials may be used in other examples. The substrate 102 may be a portion of a bulk substrate, such as a wafer of single crystal silicon, a silicon-on-insulator (SOI) substrate, such as a layer of silicon on a layer of insulating material on another layer of silicon, or another type of substrate.

In the example, there is a gate dielectric layer 104 formed on the substrate 102 and a gate electrode 106 on the gate dielectric layer 104. Further, there are spacers 108 adjacent sidewalls of the gate dielectric layer 104 and gate electrode 106. In one embodiment, the gate electrode 106 comprises polysilicon and the gate dielectric layer 104 comprises silicon dioxide. In another embodiment, the gate electrode 106 comprises a metal material and the gate dielectric layer 104 comprises a high-k material such as a hafnium oxide or other high-k material. In yet other embodiments, the gate dielectric layer 104 and gate electrode 106 may comprise different materials suitable for use as a gate dielectric layer 104 and gate electrode 106. Any suitable material or materials may be used for the spacers 108. While each is pictured as a single layer, one or more than one of the gate dielectric layer 104, gate electrode 106, and spacers 108 may comprise multiple layers. In various embodiments, the gate electrode 106 may be a gate electrode 106 for a planar transistor, a gate electrode 106 for a multi-gate transistor, or a gate electrode 106 for another type of transistor. In non-transistor devices 100 or devices 100 that are a different type of transistor, one or both of the gate dielectric layer 104 and gate electrode 106 may be missing.

In the embodiment shown in FIG. 1, the device 100 includes a source contact region 110*a* and a drain contact region 110*b*. In some embodiments, these contacts 110 comprise a silicide. In an embodiment, the contacts 110 comprise a nickel salicide. In other embodiments, the contacts 110 may comprise a silicide of another metal, such as cobalt, platinum, erbium, ytterbium, or aluminum, or another material. There is a source boundary region 112*a* between the source contact 110*a* and the substrate 102 and a drain boundary region 112*b* between the drain contact 110*b* and the substrate 102. The boundary regions 112 are at a depth 114.

Device 100 has been annealed in a deuterium atmosphere during its fabrication. There are elevated levels of deuterium adjacent the boundary regions 112 of the device 100 compared to a similar device not subject to such a deuterium anneal.

Figure 2:
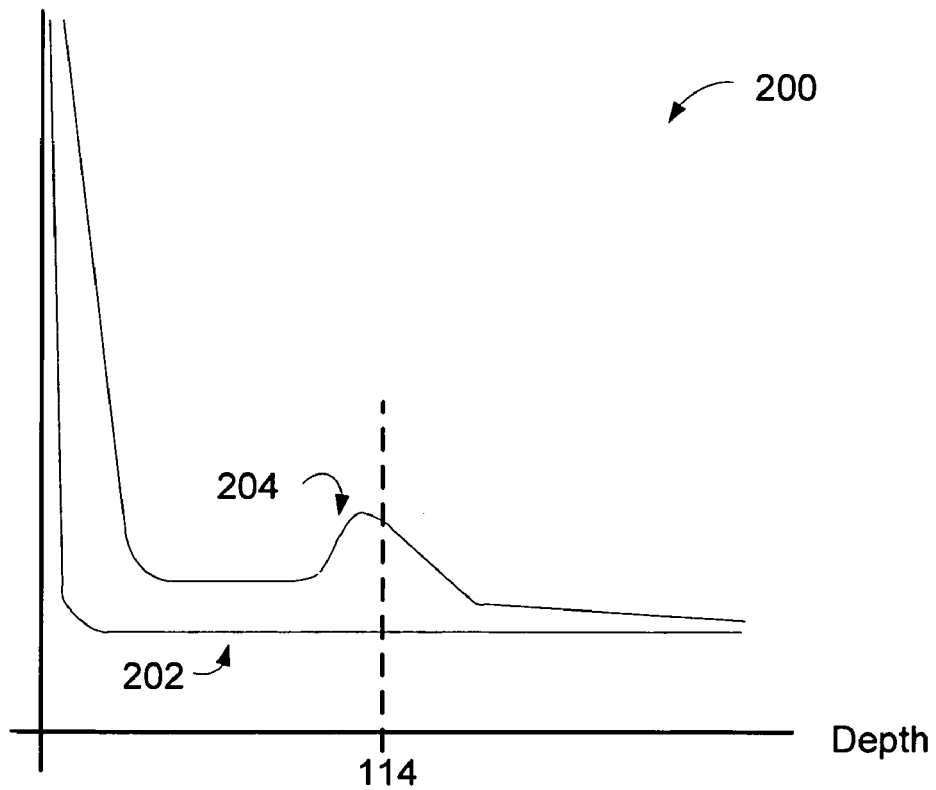
FIG. 2 shows a graph that illustrates and compares the levels of deuterium present in device compared to a similar device not subject to a deuterium anneal.

FIG. 2 shows a graph 200 that illustrates and compares the levels of deuterium present in device 100 compared to a similar device not subject to a deuterium anneal, according to one embodiment. Note that the graph 200 of FIG. 2 is for illustrative purposes only and is not an exact representation of experimental data. In the graph 200 plot 202 illustrates deuterium levels of a device not subject to a deuterium anneal, and plot 204 illustrates deuterium levels in the device 100, along line A-A of FIG. 1. The vertical axis of the graph 200 represents the concentration of deuterium, and the horizontal axis represents the depth along line A-A, with the surface being at the vertical axis and greater depths to the right.

As can be seen in plot 202, the amount of deuterium in the device without a deuterium anneal drops off quickly from the level at the surface and reaches a relatively steady concentration well before the depth 114 of the boundary regions 112.

Plot 204, in contrast, shows that the deuterium concentration of the device 100 does not dwindle to as low as that of plot 202. Plot 204 illustrates that, at a depth 114 adjacent to the boundary regions 112, there is a greater concentration of deuterium; the deuterium concentration spikes higher at depths adjacent the depth 114 of the boundary regions 112. The device 100 has elevated deuterium levels adjacent the boundary regions 112. In an embodiment, the device 100 has a deuterium concentration at depths adjacent the depth 114 of the boundary regions 112 above about $1*10^{17}$ atoms per cubic centimeter. In other embodiments, the device 100 has a deuterium concentration at depths adjacent the depth 114 of the boundary regions 112 above about $1.5*10^{16}$ atoms per cubic centimeter. In yet other embodiments, the device 100 has a deuterium concentration at depths adjacent the depth 114 of the boundary regions 112 above about $1*10^{18}$ atoms per cubic centimeter.

In the device 100, having the elevated deuterium level adjacent boundary regions 112 may provide advantages in some embodiments. The deuterium may passivate dangling bonds that would otherwise be present at the boundaries 112 between the contact regions 110 and the substrate 102. Absent this passivation, the silicidation of the contact regions 110 could result in increased nickel pipes that could cause device 100 leakage or other unwanted effects.

Figure 3:
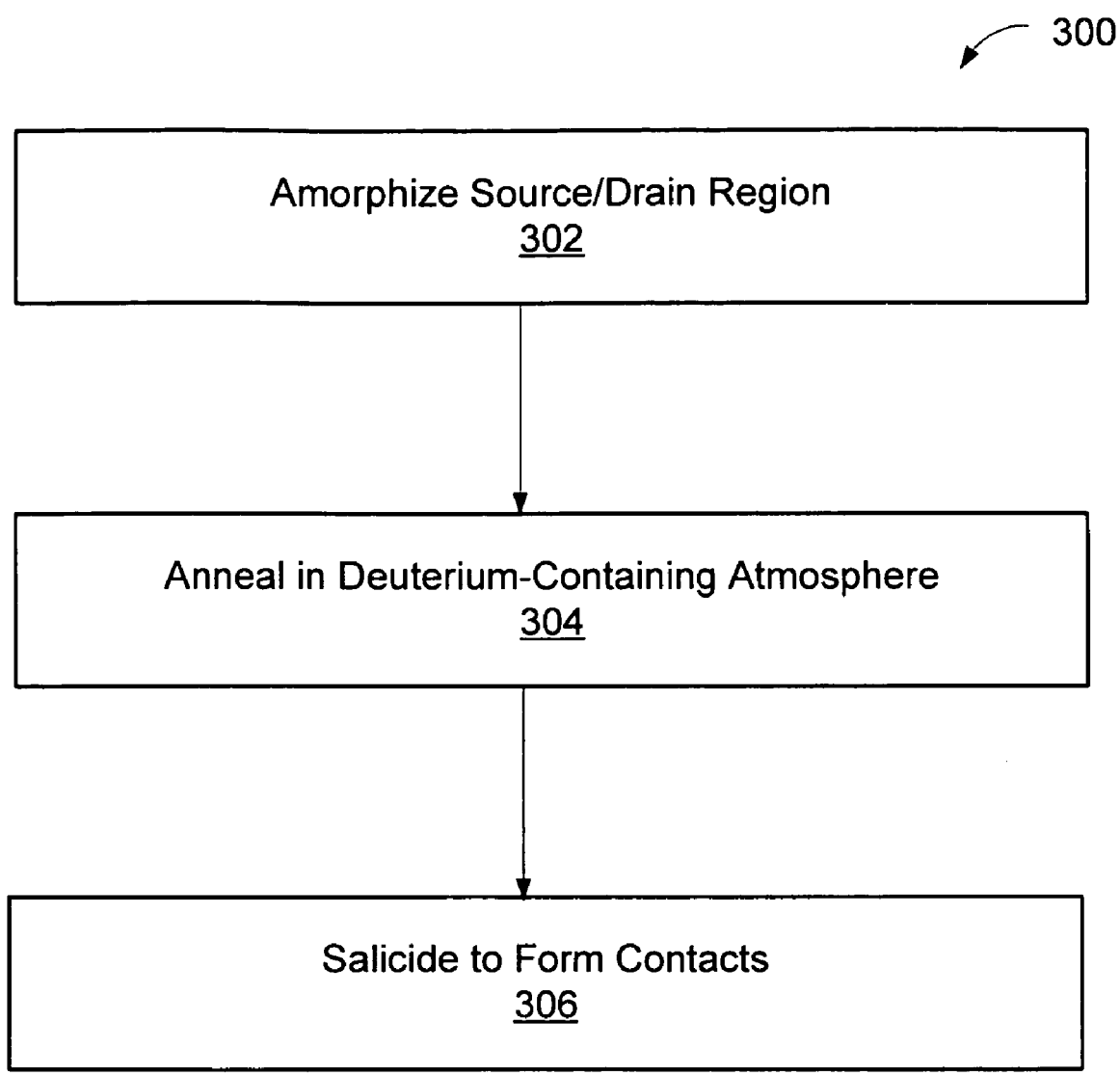
FIG. 3 is a flow chart that describes how the device may be made with elevated deuterium concentration.
Figure 4:
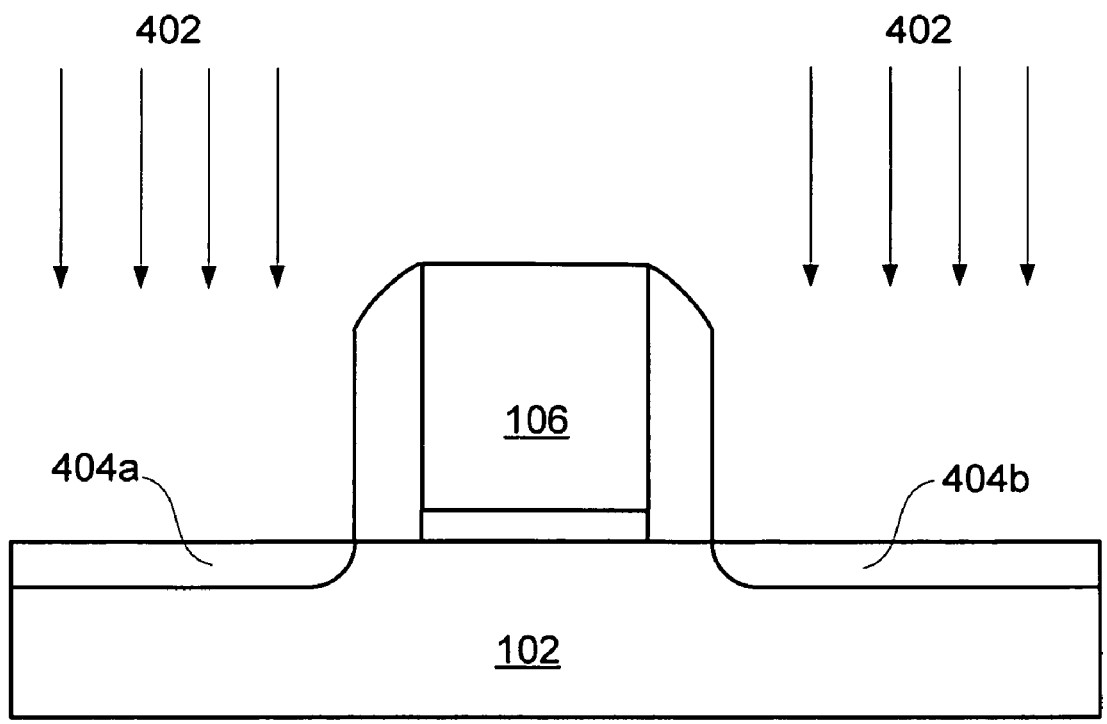
FIG. 4 is a cross sectional side view that illustrates this amorphization.
Figure 5:
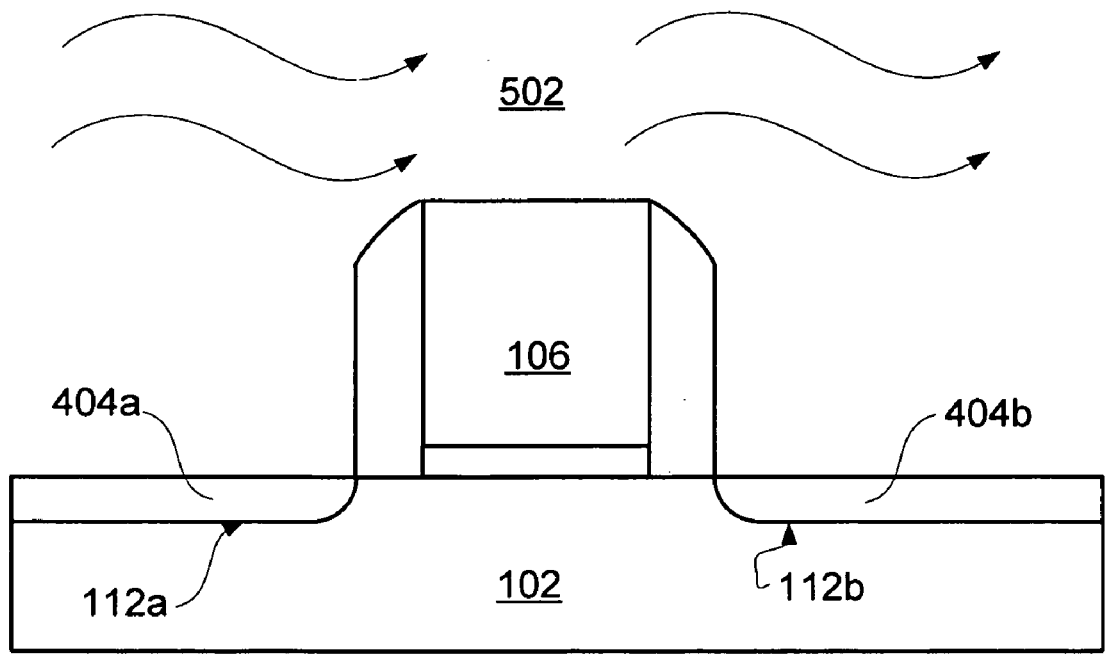
FIG. 5 is a cross-sectional side view that illustrates this annealing.

FIG. 3 is a flow chart 300 that describes how the device 100 may be made with elevated deuterium concentration at depths adjacent the boundary regions 112. FIGS. 4 and 5 are cross-sectional side views that illustrate some of the operations of the flow chart 300.

In the flow chart 300 of FIG. 3, the source region 404a and drain region 404b are amorphized 302. FIG. 4 is a cross sectional side view that illustrates this amorphization 302. In an embodiment, germanium 402 is implanted to amorphize the crystalline structure of silicon substrate 102, and result in amorphous microstructure of the source and drain regions 404. At the conclusion of the amorphization 302, there may be dangling bonds at the interface between the amorphous source and drain regions 404 and the crystal substrate 102.

The device 100 is then annealed 304 in a deuterium-containing atmosphere. FIG. 5 is a cross-sectional side view that illustrates this annealing 304. The atmosphere adjacent the device contains elevated levels of deuterium 502 during the anneal. In an embodiment, the atmosphere is substantially 100% deuterium (although trace amounts of other gases may be present). In other embodiments, less deuterium may be present, such as an atmosphere of 50% deuterium, 25% deuterium, 5% deuterium or another amount.

In one embodiment, the annealing 304 is performed at 400 degrees Celsius for about two minutes. In another embodiment, the annealing is performed as a spike anneal at 400 degrees Celsius. In other embodiments, the annealing is performed at 700 degrees Celsius for two minutes or as a spike anneal. Different temperatures may be used, such as 450 degrees Celsius, 500 degrees Celsius, 525 degrees Celsius, 700 degrees Celsius, or another suitable temperature. Different anneal times may also be used in different embodiments. Besides the aforementioned spike anneal and anneal of two minutes, anneals of times more or less than two minutes may be used.

Figure 6:
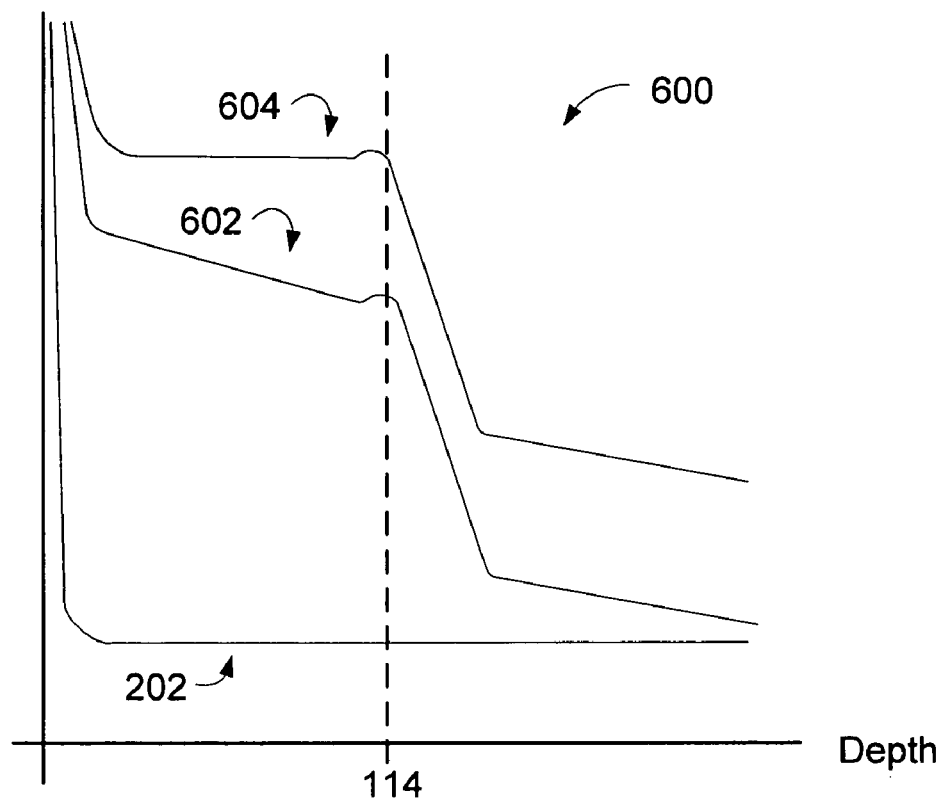
FIG. 6 is a graph that is similar to graph of FIG. 2, but illustrates deuterium levels that may result from various anneal temperatures and times.

FIG. 6 is a graph 600 that is similar to graph 200 of FIG. 2, but illustrates deuterium levels that may result from various anneal temperatures and times. The graph 600 of FIG. 6 illustrates and compares the levels of deuterium present in device 100 compared to a similar device not subject to a deuterium anneal, according to one embodiment. Note that the graph 600 of FIG. 6 is for illustrative purposes only and is not an exact representation of experimental data. In the graph 600 plot 202 illustrates deuterium levels of a device not subject to a deuterium anneal, and plots 602 and 604 illustrates deuterium levels in the device 100, along line A-A of FIG. 1, each of plots 602 and 604 illustrating a different anneal temperature and/or time.

For example, in plot 602 shows the deuterium present at various depths of an embodiment. The deuterium levels adjacent the depth 114 of the boundary regions 112 of the plot 602 of deuterium annealed device are elevated compared to that of non-deuterium annealed plot 202. Unlike plot 204 of FIG. 2, plot 602 does not drop nearly as much from surface concentrations, but gradually drops to a depth adjacent the depth 114 of the boundary regions 112, at which depth the deuterium levels are higher than those of a non-deuterium annealed device. Plot 604 is the result of different deuterium anneal conditions that cause a different deuterium concentration profile, but still has an elevated deuterium concentration adjacent the depth 114 of the boundary regions 112. Like plot 204 of FIG. 2, the deuterium concentration adjacent the depth 114 of the boundary regions 112 are above that which would be present absent a deuterium anneal. For example, plot 602 may represent the results of an anneal at about 500 degrees Celsius for about two minutes with a resulting deuterium concentration adjacent the depth 114 of the boundary regions 112 of about $1*10^{18}$ atoms per cubic centimeter. Plot 604 may represent the results of an anneal at about 525 degrees Celsius for about two minutes with a resulting deuterium concentration adjacent the depth 114 of the boundary regions 112 of above about $1*10^{19}$ atoms per cubic centimeter. Plots 602 and 604 illustrate that various embodiments annealed for different times and temperatures may have different deuterium concentration profiles, and each providing elevated concentration of deuterium adjacent the boundary regions 112.

The deuterium penetrates into the device to the boundary 112 between the source and drain regions 404 and the substrate. There, the deuterium passivates the at least a portion of the dangling bonds at the interface between the amorphous and crystal silicon. During the anneal, some of the amorphous silicon adjacent the crystal substrate may regrow its crystal structure. This may cause the boundary between the source and drain regions 404 and the substrate 102 to move to a shallower depth.

The device 100 is then salicided 306 to form the source contact region 110a and drain contact region 110b. In an embodiment, this is a nickel salicide, although other metals could be used. As described above, FIG. 1 is a cross sectional side view that illustrates the device 100 after salicidation. As the deuterium has passivated the interface between the amorphous silicon and crystal silicon, nickel pipes (if nickel silicide is formed) and other defects are greatly reduced.

Figure 7:
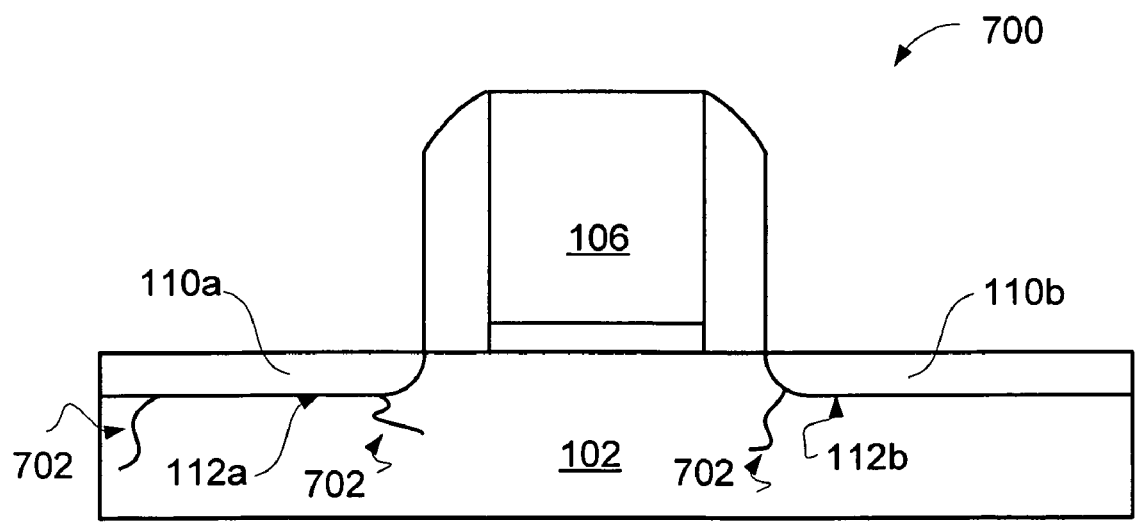
FIG. 7 is a cross sectional side view that illustrates a device similar to the device illustrated in FIG. 1.

FIG. 7 is a cross sectional side view that illustrates a device 700 similar to the device 100 illustrated in FIG. 1. However, device 700 of FIG. 7 has not been deuterium annealed, dangling bonds at the interface between the amorphous source and drain regions and the crystal substrate 102 were not passivated, and it does not have elevated levels of deuterium at the boundary 112 between the source and drain contact regions 110 and the substrate 102. During salicidation, nickel pipes 702 formed along defects because the dangling bonds were not passivated. These nickel pipes can cause leakage or other problems that hurt the performance of the device 700. By performing the deuterium anneal, the device 100 may have better performance.

Figure 8:
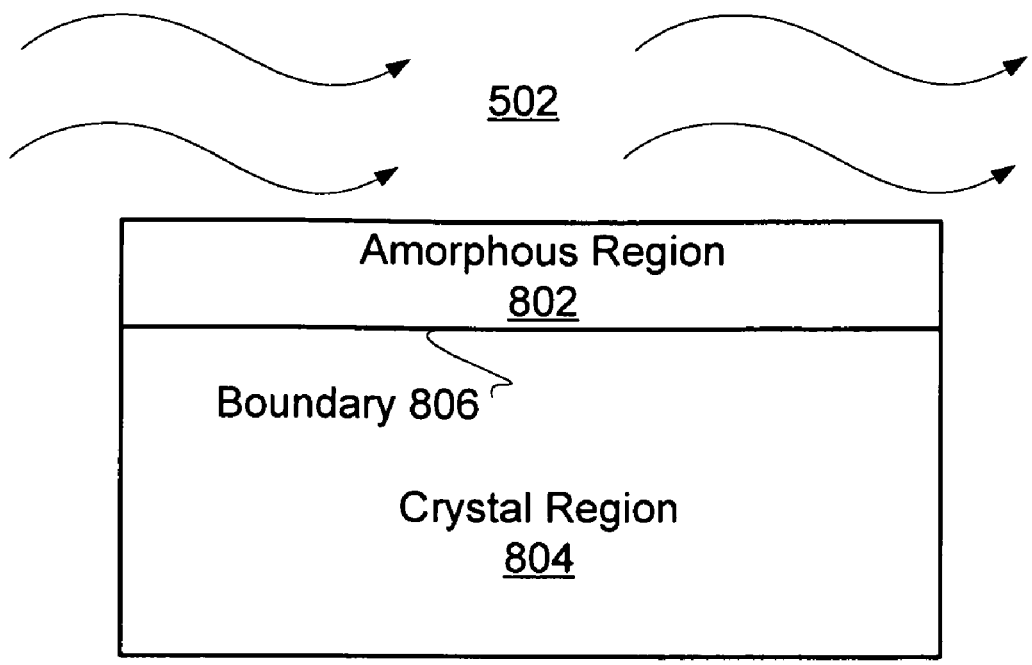
FIGS. 8 and 9 are a cross sectional side views that illustrate the general applicability of the deuterium anneal to passivate an interface or boundary.
Figure 9:
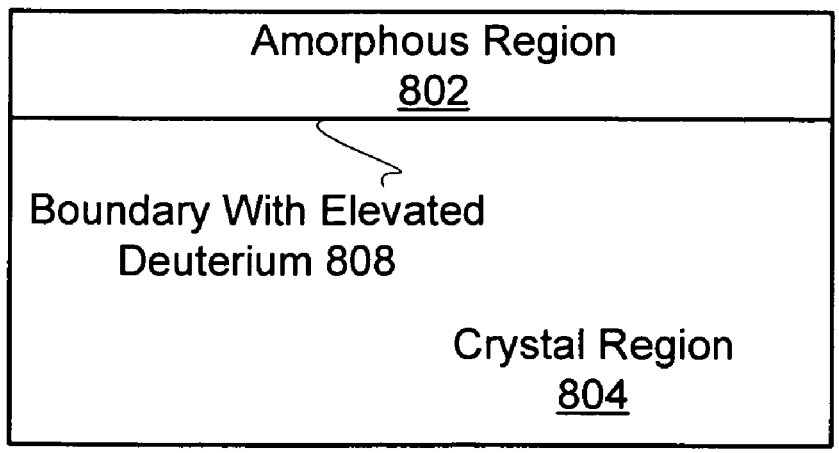

FIGS. 8 and 9 are a cross sectional side views that illustrate the general applicability of the deuterium anneal to passivate an interface or boundary. FIG. 8 illustrates a boundary 806 between an amorphous region 802 and a crystal region 804. FIG. 5 illustrated one instance of such a boundary 806: the one between the source and drain regions 404 and the substrate 102. However, the boundary 806 is not limited to that particular location within a transistor; it may be any boundary between an amorphous region 802 and a crystal region 804. In one embodiment, the amorphous region 802 may comprise amorphous silicon, and the crystal region 804 crystal silicon, although they may comprise other materials. The regions 802, 804 of FIG. 8 are annealed in a deuterium 502 atmosphere, as described above with respect to FIG. 5. FIG. 9 shows the regions 802, 804 after the deuterium anneal. The deuterium has penetrated to the boundary between the regions 802, 804, and the boundary region 808 now has an elevated deuterium concentration. As noted before, the boundary 808 post-anneal may be at a different depth than the boundary 806 pre-anneal due to a portion of the amorphous region 802 regrowing during the anneal.

Figure 10:
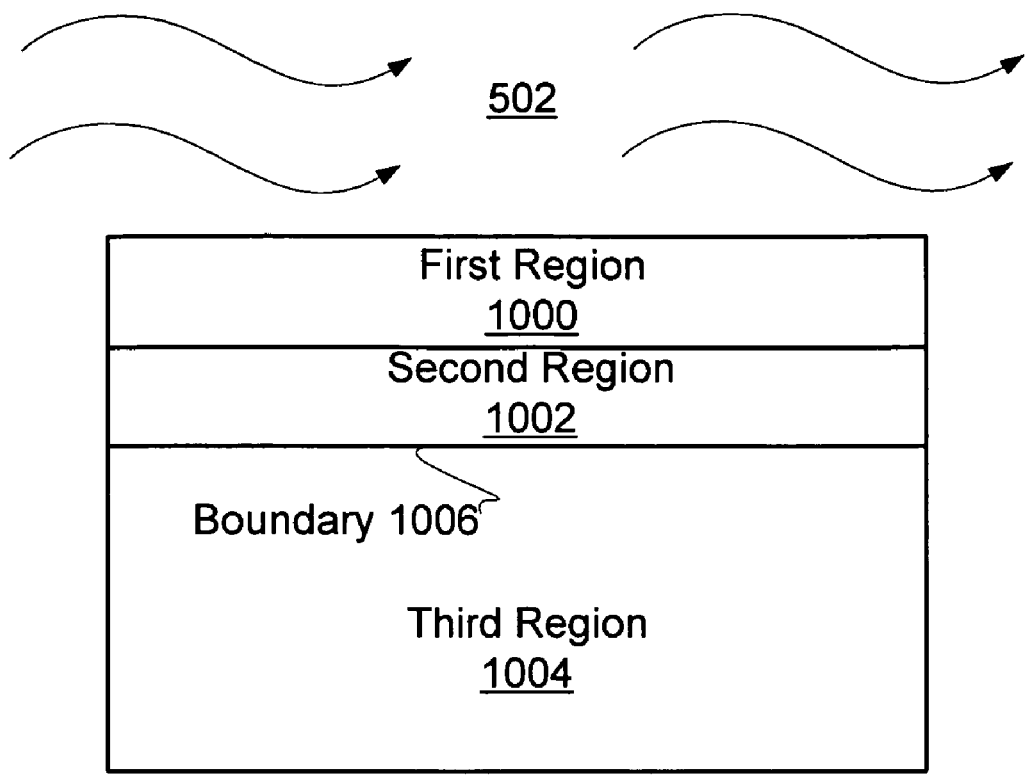
FIGS. 10 and 11 are a cross sectional side views that show another embodiment to yet again illustrate the general applicability of the deuterium anneal to passivate an interface or boundary.
Figure 11:
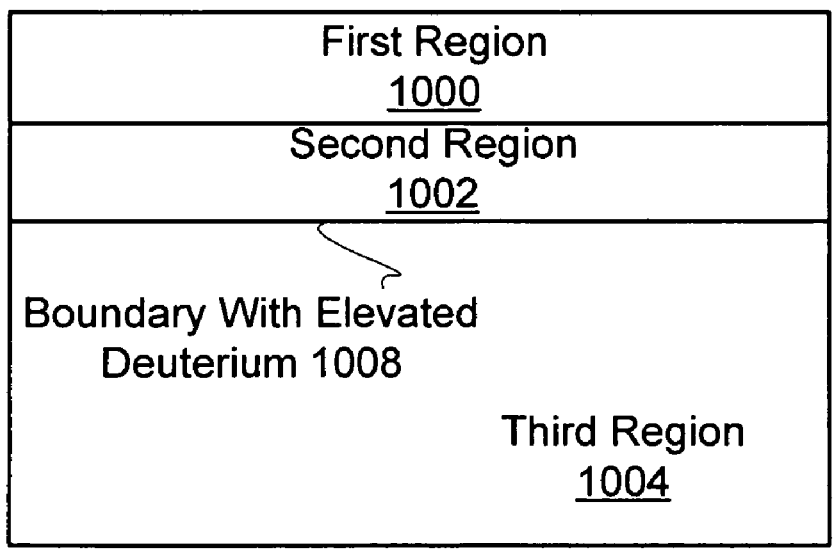

FIGS. 10 and 11 are a cross sectional side views that show another embodiment to yet again illustrate the general applicability of the deuterium anneal to passivate an interface or boundary. FIG. 10 illustrates a boundary 1006 between a second region 1002 and a third region 1004. There is also a first region 1000 on the second region 1002. However, the boundary 1006 is not limited to a particular location or material; nor is it limited to being between amorphous and crystal structures of the same material. For example, in one embodiment, the first region 1000 comprises cobalt, the second region 1002 comprises silicon oxide, and the third region 1004 comprises single-crystal silicon, although they may comprise other materials in other embodiments. The regions 1000, 1002, 1004 of FIG. 10 are annealed in a deuterium 502 atmosphere, as described above with respect to FIG. 5. FIG. 11 shows the regions 1000, 1002, 1004 after the deuterium anneal. The deuterium has penetrated to the boundary between the second and third regions 1002, 1004, and the boundary region 1008 now has an elevated deuterium concentration. As noted before, the boundary 1008 post-anneal may be at a different depth than the boundary 1006 pre-anneal.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

We claim:

1. A semiconductor device, comprising:
   a substrate;
   a contact region adjacent the substrate; and
   a boundary between the substrate and the contact region, a region adjacent the boundary having deuterium present in a concentration greater than $1 \times 10^{17}$ atoms per cubic centimeter; and
   wherein a deuterium concentration in the contact region is higher immediately adjacent the boundary than in some portions of the contact region further from the boundary.

2. A semiconductor device, comprising:
   a substrate, wherein the substrate comprises silicon;
   a contact region adjacent the substrate; and
   a boundary between the substrate and the contact region, a region adjacent the boundary having deuterium present in a concentration greater than $1 \times 10^{17}$ atoms per cubic centimeter.

3. The device of claim 2, further comprising:
   a gate electrode, the contact region being to a first side of the gate electrode;
   a second contact region adjacent the substrate on a second side of the gate electrode, the second side being opposite the first side; and
   a second boundary between the substrate and the second contact, a region adjacent the boundary having deuterium present in an amount greater than $1 \times 10^{17}$ atoms per cubic centimeter.

4. The device of claim 2, wherein the region adjacent the boundary having deuterium present in a concentration greater than $1 \times 10^{18}$ atoms per cubic centimeter.

5. A semiconductor device, comprising:
   a substrate;
   a contact region adjacent the substrate, wherein the contact region comprises a silicide material; and
   a boundary between the substrate and the contact region, a region adjacent the boundary having deuterium present in a concentration greater than $1 \times 10^{17}$ atoms per cubic centimeter.

6. The device of claim 5, wherein the contact region comprises nickel silicide.

7. A semiconductor device, comprising:
   a first region, wherein the first region is a source contact of a transistor that comprises a silicide material;
   a second region adjacent the first region, wherein the second region is a substrate that comprises silicon; and
   a boundary region between the first region and the second region, the boundary region having deuterium present in a concentration greater than $1 \times 10^{17}$ atoms per cubic centimeter.

* * * * *